United States Patent
Gutermuth

(10) Patent No.: US 12,046,883 B2
(45) Date of Patent: Jul. 23, 2024

(54) CABLE FIXING ACCESSORY

(71) Applicant: ABB AG, Mannheim (DE)

(72) Inventor: Stefan Gutermuth, Lorsch (DE)

(73) Assignee: ABB AG, Mannheim (DE)

( * ) Notice: Subject to any disclaimer, the term of this patent is extended or adjusted under 35 U.S.C. 154(b) by 536 days.

(21) Appl. No.: 17/115,817

(22) Filed: Dec. 9, 2020

(65) Prior Publication Data

US 2021/0175696 A1 Jun. 10, 2021

(30) Foreign Application Priority Data

Dec. 9, 2019 (DE) .................. 102019 219 182.7

(51) Int. Cl.
| | |
|---|---|
| *G06F 1/16* | (2006.01) |
| *H02G 3/04* | (2006.01) |
| *H05K 5/00* | (2006.01) |
| *H05K 7/00* | (2006.01) |
| *H05K 7/14* | (2006.01) |

(52) U.S. Cl.
CPC ......... *H02G 3/0456* (2013.01); *H05K 7/1468* (2013.01); *H05K 7/1482* (2013.01)

(58) Field of Classification Search
CPC .. H05K 7/1468; H05K 7/1482; H05K 7/1491; H02G 3/0456; H02G 3/0437; H02G 3/045; H02G 3/0481; G02B 6/4463
See application file for complete search history.

(56) References Cited

U.S. PATENT DOCUMENTS

| | | | |
|---|---|---|---|
| 5,731,546 A | 3/1998 | Miles et al. | |
| 6,539,161 B2 | 3/2003 | Holman et al. | |
| 6,600,107 B1 | 7/2003 | Wright et al. | |
| 6,715,619 B2 | 4/2004 | Kim et al. | |
| 6,865,331 B2 * | 3/2005 | Mertesdorf | G02B 6/4455 |
| | | | 385/135 |
| 7,014,905 B1 | 3/2006 | Linton | |
| 7,119,280 B1 * | 10/2006 | Ray | H02G 3/18 |
| | | | 174/72 A |

(Continued)

FOREIGN PATENT DOCUMENTS

| | | |
|---|---|---|
| CN | 1328264 A | 12/2001 |
| CN | 109155508 A | 1/2019 |

(Continued)

OTHER PUBLICATIONS

China National Intellectual Property Administration, Office Action in Chinese Patent Application No. 202011430856.4, 12 pp. (dated Nov. 2, 2022).

(Continued)

*Primary Examiner* — Anthony M Haughton
(74) *Attorney, Agent, or Firm* — Leydig, Voit & Mayer, Ltd.

(57) ABSTRACT

A cable fixing accessory includes: a cylinder segment having a surface with a predefined radius of curvature. The surface of the cylinder segment bends a cable having an electrically conductive core at least partially around the surface of the cylinder segment. The radius of curvature of a portion of the surface of the cylinder segment, which has direct contact with the cable, is greater than or equal to six times a diameter of the electrically conductive core of the cable.

17 Claims, 6 Drawing Sheets

(56) References Cited

U.S. PATENT DOCUMENTS

| | | | | |
|---|---|---|---|---|
| 7,171,099 | B2* | 1/2007 | Barnes | G02B 6/4457 384/19 |
| 7,373,071 | B2* | 5/2008 | Douglas | G02B 6/4452 385/134 |
| 7,773,850 | B2* | 8/2010 | Caveney | G02B 6/4452 385/134 |
| 2002/0113434 | A1* | 8/2002 | Tresch | H02G 15/007 285/260 |

FOREIGN PATENT DOCUMENTS

| | | |
|---|---|---|
| DE | 8703304 U1 | 6/1987 |
| DE | 102013108359 A1 | 2/2015 |
| EP | 1178251 A2 | 2/2002 |
| EP | 2731215 A1 | 5/2014 |
| JP | 2009-282177 A | 12/2009 |
| WO | 2012/168655 A1 | 12/2012 |
| WO | WO 2013/056329 A1 | 4/2013 |

OTHER PUBLICATIONS

China National Intellectual Property Administration, Search Report in Chinese Patent Application No. 202011430856.4, 10 pp. (dated Feb. 24, 2022).

DIN EN IEC 61010-2-201 "Safety requirements for electrical equipment for measurement, control, and laboratory use—Part 2-201: Particular requirements for control equipment" IEC 61010-2-201:2017; German version EN IEC 61010-2-201:2018, Apr. 2019, pp. 1 and 28, (VDE 0411-2-201 ):Jan. 2014, European Committee for Standards, Germany.

China National Intellectual Property Administration, Notification to Grant in Chinese Patent Application No. 202011430856.4, 6 pp. (Jan. 4, 2023).

* cited by examiner

CABLE FIXING ACCESSORY

CROSS-REFERENCE TO PRIOR APPLICATION

Priority is claimed to German Patent Application No. DE 10 2019 219 182.7, filed on Dec. 9, 2019, the entire disclosure of which is hereby incorporated by reference herein.

FIELD

The invention relates to the field of cable fixing devices, in particular for electric cables. It also relates to the use of a cable fixing device.

BACKGROUND

Electrical and/or electronic devices often have or require many connections. This can lead to a high number of cables that have to be connected to the devices. For example, cables can, at least in some cases, be laid in an undefined way and therefore carry the risk of breakage, e.g. near—or due to—an edge or corner around which they can be laid.

SUMMARY

In an embodiment, the present invention provides a cable fixing accessory, comprising: a cylinder segment having a surface with a predefined radius of curvature, wherein the surface of the cylinder segment is configured to bend a cable having an electrically conductive core at least partially around the surface of the cylinder segment, and wherein the radius of curvature of a portion of the surface of the cylinder segment, which is configured to have direct contact with the cable, is greater than or equal to six times a diameter of the electrically conductive core of the cable.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 3:
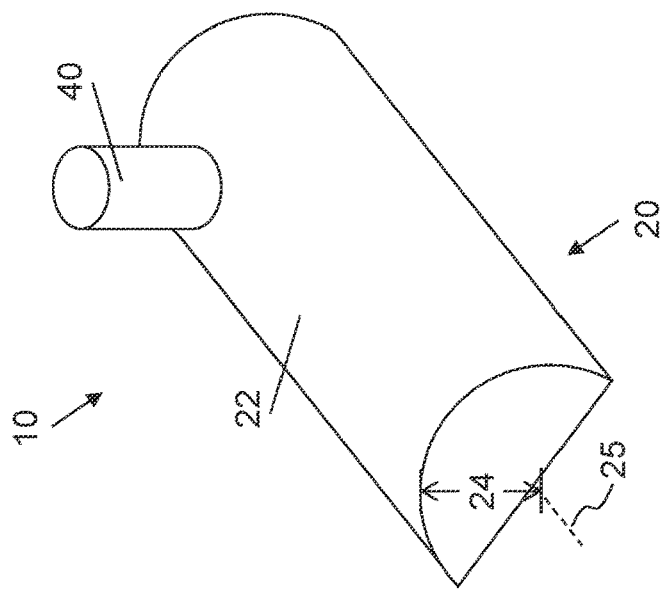
FIG. 3 shows a perspective view of a cable fixing accessory according to another embodiment.

There may be a desire to at least reduce the risk of cable breakage on a path of the cable from or to an electrical and/or electronic device.

One aspect relates to a cable fixing accessory that comprises a cylinder segment with a surface with a predetermined radius of curvature. The surface is designed to bend a cable with an electrically conductive core at least partially around the surface of the cylinder segment. The radius of curvature of a portion of the surface adapted to have direct contact with the cable is greater than or equal to six times the diameter of the core of the cable.

The cylinder segment may be hollow—e.g. in the form of a shell—or solid and/or everything "in between", i.e. it may be partially solid, with stabilising ribs extending radially and/or axially from a central axis of the cylinder segment to an area below the surface of the cylinder segment. The cylinder segment may not be a "mathematically exact" cylinder segment. Accordingly, the radius of curvature and predefined angle of the cylinder segment may differ from a "mathematically exact" definition of the radius and/or angle of a cylinder segment. The cable fixing accessory is designed to bend the cable at least partially around the surface of the cylinder segment. Therefore, at least areas of the surface of the cylinder segment that are designed and/or adapted for direct contact with the cable have a radius of curvature greater than or equal to six times the diameter of the electrically conductive core of the cable.

The cable may consist of one cable, several cables, a cable bundle (e.g. arranged horizontally), a cable stack or cable bundles and/or other cable arrangements.

The surface may be partially interrupted or broken. The width of the surface can vary along the radius of curvature. The cylinder segment may include at least one boundary area in an area near its axial ends, which may be rounded, flattened, stepped and/or have other shapes or combinations of these shapes. Since neither the interrupted area(s) nor the boundary area(s) have direct contact with the cable, these areas may have a smaller radius of curvature, especially at their boundaries.

An advantage of the cable fixing accessory is that by simply guiding the cable to be laid over the surface of the cable fixing accessory, a minimum radius of curvature is ensured, thus protecting the cable(s) from breaking, even if it is bent around an edge, corner or the like. This can also help to protect the cable's insulation from damage. Cable fixing accessory can also at least help to meet industry standards in a system of electrical and/or electronic components, in particular the IEC 61010-2-201:2018 standard.

In at least some embodiments, the cable fixing accessory may bear—or otherwise indicate—an instruction not to use it for cables with a conductive core diameter of more than one sixth of the surface area.

In at least some embodiments, an angle of the cylinder segment is between 30° and 190°, for example between 60° and 150°, and especially between 75° and 95°. Cylinder segments with these angles have proven to be particularly useful in protecting the cable(s) from breakage.

In at least some embodiments, the cable fixing accessory further comprises an extension member, the extension member extending in a direction substantially tangential to a central axis of the cylinder segment and having a flat and/or convex surface. The surface of the extension member is adapted to increase the surface area of the cylinder segment, and the radius of curvature of the surface of the cylinder segment and the extension member is greater than or equal to six times the diameter of the cable.

The cable fixing accessory—with or without extension element—can be formed from one piece or consist of several pieces or parts. The extension elements can be flat and/or convex. This shape can be advantageous in giving the freedom to guide a cable fixing accessory around complicated corners and/or edges. This shape can also give the freedom to adapt it to special manufacturing processes, e.g. for special shapes.

In at least some embodiments, the surface is made of a rubber-like material, for example silicone rubber and/or similar materials. This can provide slip protection for the cable(s). In addition, this material may have a softer surface that helps to protect against "hard" movements of the cable(s) due to vibration and/or other forces, thus protecting the core of the cable(s) from breaking.

In at least some embodiments, the cable fixing accessory further comprises at least one edge element, the at least one edge element protruding radially from the surface of the cylinder segment and/or extension element.

The edge elements may have any shape, e.g. the shape cylinder, rectangle, bracket and/or others. The edge elements can have a groove. The height of the edge element can depend on the intended function. Some edge elements can be designed to protect a cable harness or stack—i.e. even with a large number of cables—from shifting to the right and/or left, depending on the position of the edge element(s). Some edge elements may be designed to be held, e.g. a cable tie which may be designed to be looped around the cables. This may also help to make the cable(s) resistant to vibration and/or manual or other forces and/or to permanent movement caused, for example, by vibrations of the machine in which they are located. It can also prevent the cable(s) from slipping out of a plug (or other electrical device) or the plug from losing contact with the device on which it is mounted.

In at least some embodiments, the cable fixing accessory also includes a fixing element, the fixing element being designed to fix the cable to the cable fixing accessory. The fixing element may, for example, be a clamp, a cable tie, a cable tie and/or any other element adapted and/or suitable for fixing the cable(s) to the cable fixing accessory.

In one embodiment, the fastening element is designed to wrap axially around the cylinder segment and/or to be guided around or through at least one of the edge elements. This can be realised e.g. by a kind of groove in the cylinder segment.

Alternatively or additionally, the cable fixing accessory may comprise a first passage through the cylinder segment and/or a second passage through at least one of the edge elements, the fixing element being adapted to pass through the first passage and/or through the second passage. This may facilitate the installation of the fixing element and/or contribute to a firm fixing of the cable(s).

In at least some embodiments, the cable fixing accessory further comprises a retaining element, the retaining element being designed to hold the cable fixing accessory to a housing.

The term "enclosure" has to be interpreted broadly. This may be an enclosure of an electrical apparatus or system, a part which is fixed or in some way connected or attached to an electrical apparatus or system, and/or may be another type of "wall-mounted element"—possibly with openings—suitable for holding and/or fixing the cable fixing accessory to it. The retaining element may include, for example, a barb and/or an adjustment hook. The barb may provide a snap-on mechanism for fixing the cable fixing accessory to the enclosure. For example, the retaining element can be advantageously attached to a so-called ventilation grille area of an electrical appliance without covering it and/or disturbing the air flow of the appliance. The support element can provide means to integrate the cable fixing accessory into the ventilation grille.

In at least some embodiments, the cable fixing accessory is part of a housing or housing element. This integration makes it possible to design enclosures and/or enclosure elements—such as side panels, ventilation grilles and/or other enclosure elements—in such a way that cables are protected against breakage.

In one version, the cable fixing accessory includes two or three edge elements. The edge elements can protrude from the surface on the left, right and/or in the middle, so that one, two or even more cable bundles are attached to the cable fixing accessory.

In at least some embodiments, the cylinder segment is hollow, solid or partially solid. The cylinder segment may include internal ribs radially and/or axially to a central axis of the cylinder segment. The cylinder segment may be made of plastic. The cable fixing accessory can be designed as an optional plastic part which can be plugged by the end user onto the electrical and/or electronic device (e.g. a programmable logic controller, PLC) or its housing and/or can be an integral part of the housing.

Another aspect relates to the use of a cable fixing accessory, as above and/or described below, to bend a cable along a surface of the fixing accessory with a radius of curvature of the surface greater than or equal to six times the diameter of the cable.

Another aspect relates to an electronic device comprising a housing of a cable fixing accessory, as described above and/or below. The electronic device may be a programmable logic controller, PLC, or I/O device.

The reference numerals used in the drawings and their meaning are summarised in the list of reference numerals. In principle, the same or similar parts in the figures have the same reference numerals.

Figure 1:
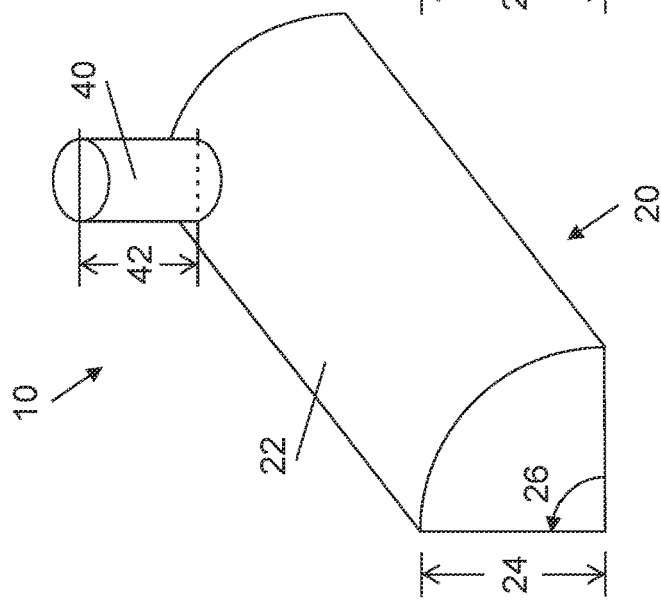
FIG. 1 shows a perspective view of a cable fixing accessory according to an embodiment.

FIG. 1 schematically shows a perspective view of a cable fixing accessory 10 according to an embodiment. The cable fixing accessory 10 comprises a cylinder segment 20 with a surface 22 which has a predetermined radius of curvature 24 and a predetermined angle 26. For better illustration, this embodiment has the shape of a cylinder segment with a predefined angle 26 of 90°. However, this should not be understood as a restrictive characteristic of the cable fixing accessory 10. Other designs may have angles 26, for example between 30° and 190°, possibly between 60° and 150°, in particular between 75° and 95°. Another embodiment may also include extension elements (see e.g. FIG. 4) which can change the overall shape of the cable fixing accessory 10 away from a "mathematically regular" cylinder segment. Further forms may include breaks and/or passages in the surface 22 and/or in the body of the cylinder segment 20 caused by a variety of reasons, e.g. manufacturing restrictions, the attachment of further components to the cylinder segment 20, design reasons and/or other reasons.

The cable fixing accessory 10 is designed to bend a cable 30 (not shown in FIG. 1) with an electrically conductive core 32 at least partially around the surface 22 of the cylinder segment 20. In an area (or a plurality of areas) of surface 22 that is/are adapted to be in direct contact with cable 30, the radius of curvature 24 of surface 22 is greater than or equal to six times the diameter 34 of cable 30. This condition may not apply to areas of surface 22 that are not in direct contact with cable 30. These areas may include breaks, passages and/or edge areas—e.g. the left or right edge—in or from surface 22.

FIG. 1 further shows an example of a boundary or edge element 40. The boundary element 40 protrudes radially from the surface 22 of the cylinder segment 20. In other versions of the cable fixing accessory 10, which include an extension element 28 (not shown in FIG. 1), the boundary element 40 may project radially from the surface 22 of the extension element 28 and/or from the surface 22 of the cylinder segment 20. The boundary elements 40 can have any shape, e.g. cylinder, rectangle, and/or other. The number of edge elements 40 can be one (as shown), two or more. An embodiment with an edge element 40, which can be placed near the right edge of surface 22, for example, can be used to prevent cables from sliding to the right. The edge element 40 may have a groove and/or a lead-through (not shown in FIG. 1); these elements of the edge element 40 may be designed for fixing, e.g. a fixing element such as a cable tie and/or other types of fixing elements. The height 42 of the boundary element 40 may depend on the purpose for which the boundary element 40 is intended. Examples may be a comparatively large height of the boundary element 40, e.g. to "align" a stack of cables and/or to provide resistance of the cables to movement, or a comparatively small height of the boundary element 40, e.g. to provide a feed-through for a cable tie.

Figure 2:
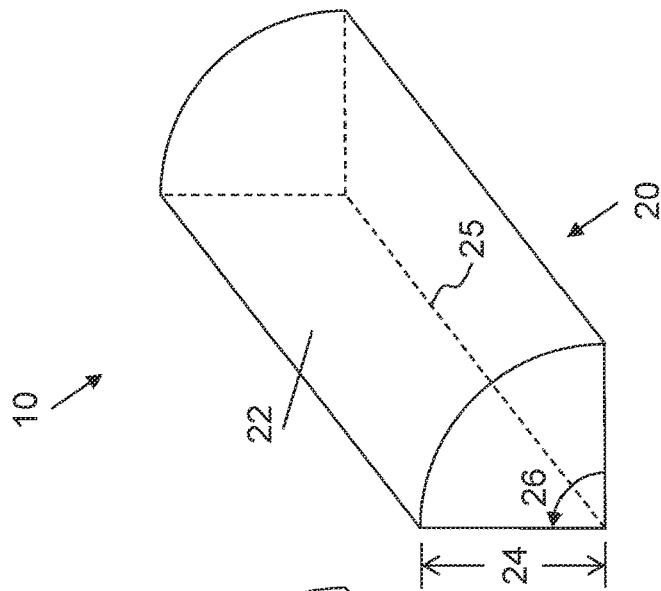
FIG. 2 shows a perspective view of a cable fixing accessory according to another embodiment.

FIG. 2 schematically shows a perspective view of a cable fixing accessory 10 according to another embodiment. This embodiment is largely identical to that of FIG. 1, with the exception of the edge element 40. The dotted lines clearly show an internal structure of the cable fixing accessory 10. As this embodiment has the shape of a cylinder segment 20 with a predefined angle 26 of 90°, a central axis 25 of the cylinder segment 20 is located in a corner of the cylinder segment 20.

FIG. 3 schematically shows a perspective view of a cable fixing accessory 10 according to another embodiment. The cable fixing accessory 10 shown here comprises a cylinder segment 20 with an angle of less than 180°, the centre axis 25 of which lies outside the cylinder segment 20.

Figure 4:
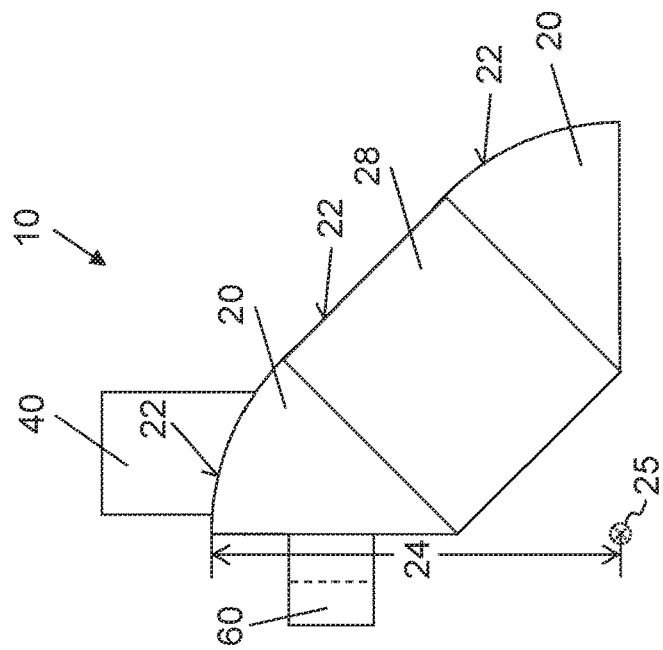
FIG. 4 shows a side view of a cable fixing accessory according to another embodiment.

FIG. 4 schematically shows a side view of a cable fixing accessory 10 according to another embodiment. This cable fixing accessory 10 comprises an extension element 28 which extends in a direction substantially tangential to a central axis 25 (shown with dotted lines) of cylinder segment 20. The surface 22 of the extension element 28 is designed to increase the surface 22 of cylinder segment 20. The radius of curvature 24 of the surface 22 of the cylinder segment 20 and the extension element 28 is greater than or equal to six times the diameter 34 of the cable 30. The shape shown is a kind of "pure" shape in relation to a "mathematically close" definition. There may be shapes of the cable fixing accessory 10 which have deviations and/or variations from the shapes shown here. Examples may be, but are not limited to: a cable fixing accessory 10 with breaks and/or passages in the surface 22, the extension element 28 and/or in the body of the cylinder segment 20, with convex parts of the surface 22 of the extension element 28 and/or deviating shapes of edge areas in or from the surface 22 and/or the extension element 28. However, in all areas of the surface 22 of the cylinder segment 20 and/or the extension element 28 which are adapted to have direct contact with the cable 30, the radius of curvature 24 of the surface 22 is greater than or equal to six times the diameter 34 of the cable 30.

The cable fixing accessory 10 consists of a retaining element 60, which may be configured as a barb and/or an adjustment hook. The retaining element 60 is designed to hold the cable fixing accessory 10 to a housing. The term "housing" must be interpreted broadly. This may be an enclosure of an electrical apparatus or system, a part which is fixed or somehow connected or connected to an electrical apparatus or system, and/or another type of "wall-like element"—possibly with openings—suitable for holding the cable fixing accessory to it.

Figure 5:
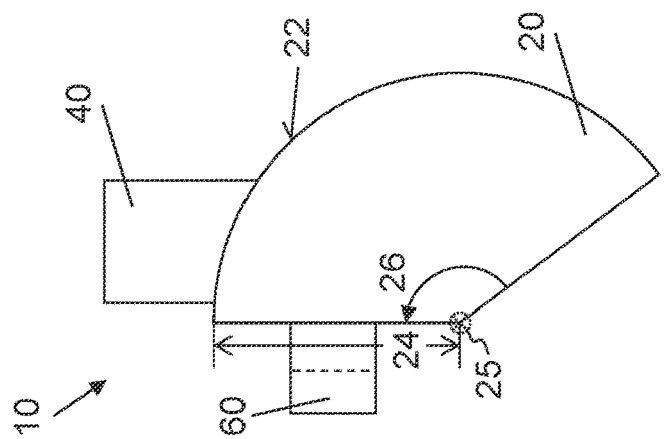
FIG. 5 shows a side view of a cable fixing accessory according to another embodiment.

FIG. 5 schematically shows a side view of a cable fixing accessory 10 according to another embodiment. This exemplary embodiment shows a cylinder segment 20 with an angle 26 of approx. 140°.

Figure 6:
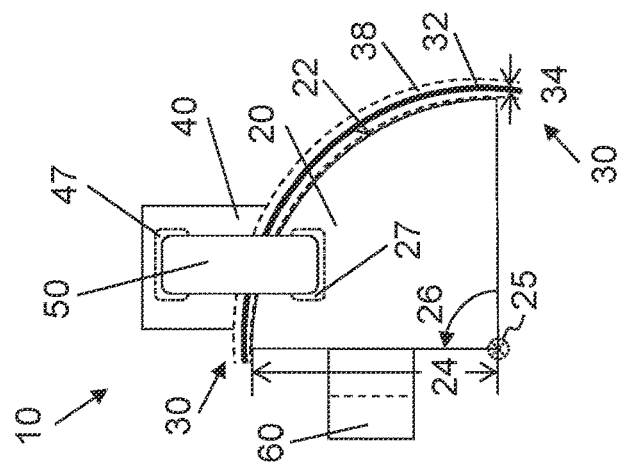
FIG. 6 shows a side view of a cable fixing accessory according to another embodiment.

FIG. 6 schematically shows a side view of a cable fixing accessory 10 according to another embodiment. FIG. 6 also shows a cable 30 which is bent around the cylinder segment 20 and whose surface has 22 direct contact with the cable 30. The cable 30 comprises an electrically conductive core 32 and an insulation or insulating element 38. The electrically conductive core 32 has a diameter 34. The radius of curvature 24 of the area of the surface 22 that has direct contact with the cable 30 (in FIG. 6) is greater than or equal to six times the diameter 34 of the cable 30.

The cable fixing accessory 10 consists of a retaining element 60, which can be designed as a barb and/or an adjustment hook. The cable fixing accessory 10 consists of a fixing element 50, which is designed as a cable tie or clip. The fixing element 50 is arranged through a first passage 27, which passes through the cylinder segment 20, and a second passage 47, which passes through at least one of the edge elements 40. By passing through the first passage 27 and the second passage 47, the fixing element 50 can fix the cable 30 to the cable fixing accessory 10. Instead of or in addition to the bushings, the cylinder segment 20 and/or the edge element(s) 40 may have a groove or the like, which are designed to fix the fixing element 50. Instead of or in addition to the edge element(s) 40, the fixing element 50 may—instead of or in addition to the edge element(s) 40—contribute to making the cable fixing accessory 10 robust against vibrations and/or manual forces and/or permanent movements caused, for example, by vibrations of the machine in which they are located. It can also help to prevent cables from slipping out of the plug and/or a plug losing contact with the machine.

Figure 7:
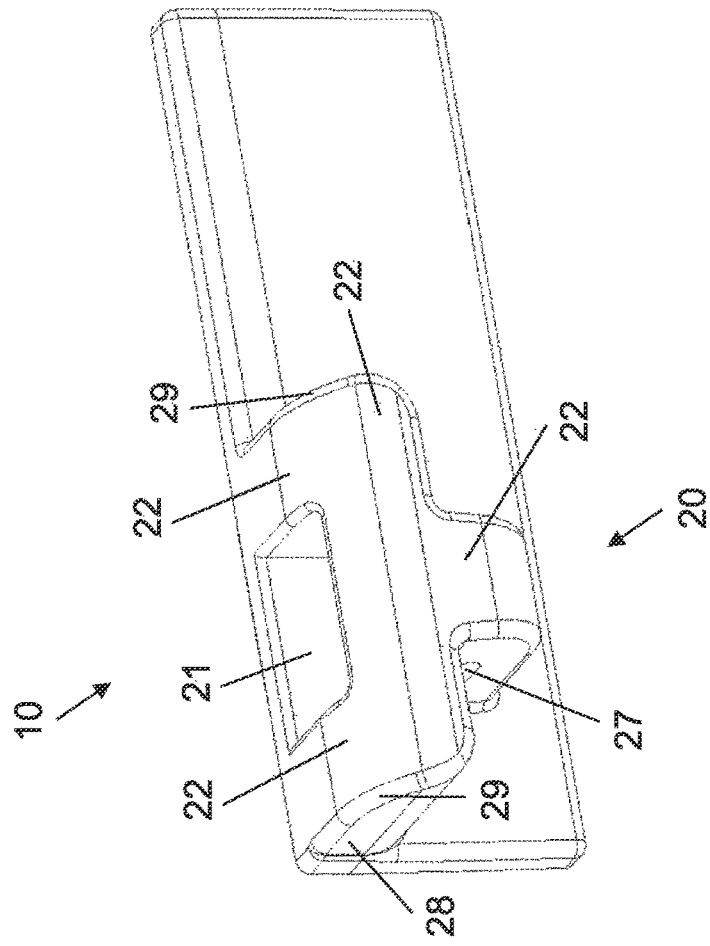
FIG. 7 shows a perspective view of a cable fixing accessory according to another embodiment.

FIG. 7 schematically shows a perspective view of a cable fixing accessory 10 according to another embodiment. The cable fixing accessory 10 consists of one or more cylinder segments 20 and extension elements 28, which together form a surface 22. A radius of curvature 24, measured at any point on the surface 22 of the cylinder segment 20 and/or the extension element 28, is greater than or equal to six times the diameter 34 of a cable 30 (not shown in FIG. 7), the cable fixing accessory 10 being adapted to bend the cable 30 at least partially around the surface 22. This condition does not apply, e.g. for an edge area 29 and/or an undercut 21, which can help to improve an injection moulding process. The cable fixing accessory 10 shown also includes a passage 27 in the housing of the cylinder segments 20 and/or extension elements 28. The passage 27 can be used to fix a cable 30 to the cable fixing accessory 10.

Figure 8:
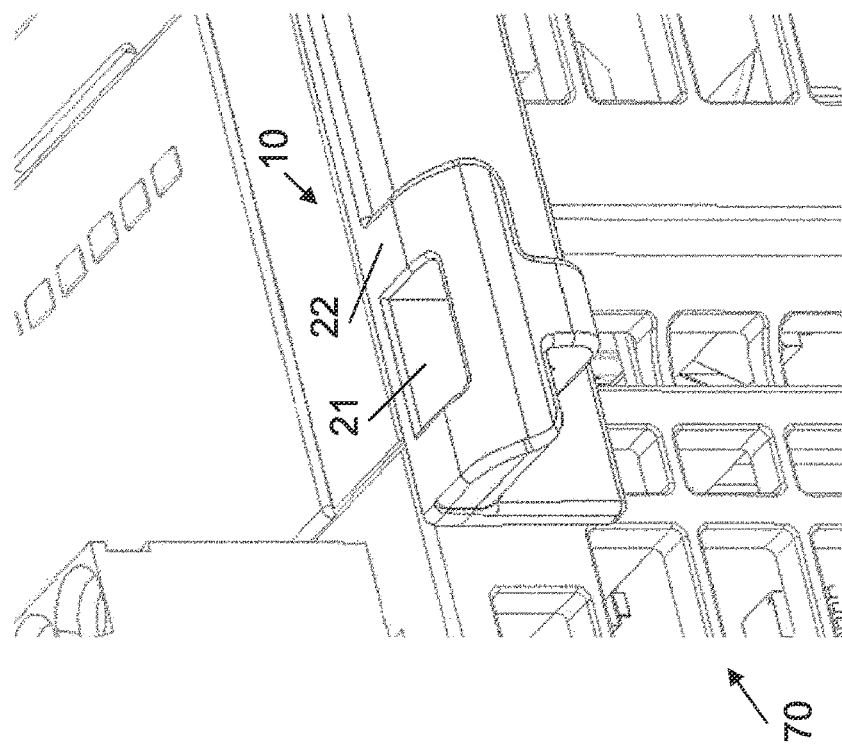
FIG. 8 shows a perspective view of the cable fixing accessory attached to a housing of FIG. 7.

FIG. 8 schematically shows a perspective view of the cable fixing accessory 10 from FIG. 7, which is attached to a housing 70. The cable fixing accessory 10 can be fixed to the housing 70 with a retaining element 60 (not shown in FIG. 8), which is e.g. located on the back of the cable fixing accessory 10. The retaining element 60 can be designed as a barb, for example, which provides a snap mechanism for snapping into openings in the housing 70. The retaining element 60 can be designed as an adjustment hook that corresponds to openings in the housing 70 and can engage in these openings with a tight fit when fastened. The retaining element 60 can, for example, be designed as part of the housing 70, in particular as an integral part of the housing 70.

Figure 9:
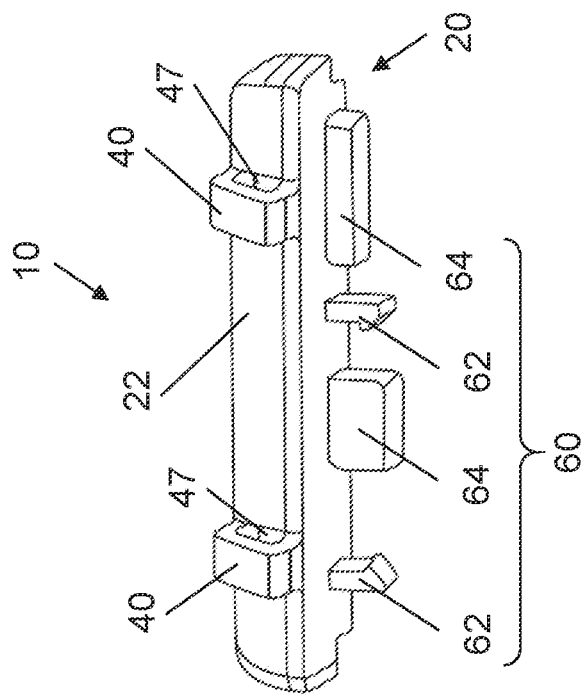
FIG. 9 shows a perspective view of a cable fixing accessory according to another embodiment.

FIG. 9 schematically shows a perspective view of a cable fixing accessory 10 according to another embodiment. The cable fixing accessory 10 comprises a cylinder segment 20 with a surface 22. The cable fixing accessory 10 is designed to bend a cable 30 with an electrically conductive core 32 at least partially around the surface 22 of the cylinder segment 20. The cable fixing accessory 10 consists of two edge elements 40, each with a bushing 47. The bushing 47 can be useful for fixing a cable 30 (not shown in FIG. 9), e.g. with a fixing element 50 (not shown in FIG. 9), to the cable fixing accessory 10.

Figure 10:
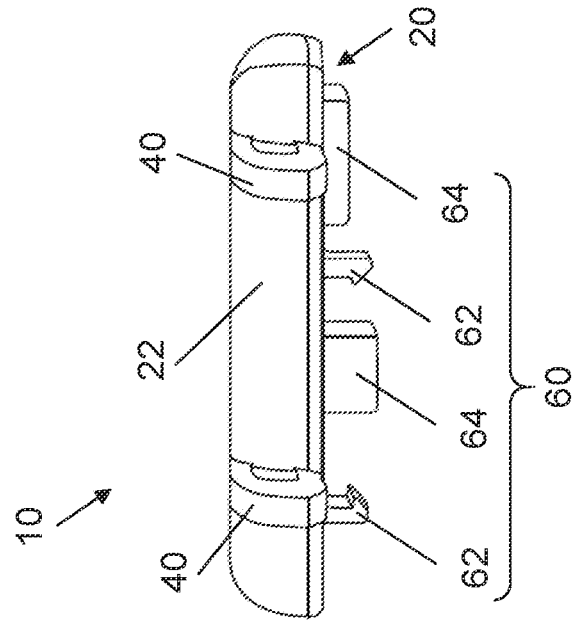
FIG. 10 shows another perspective view of the cable fixing accessory of FIG. 9.
Figure 14:
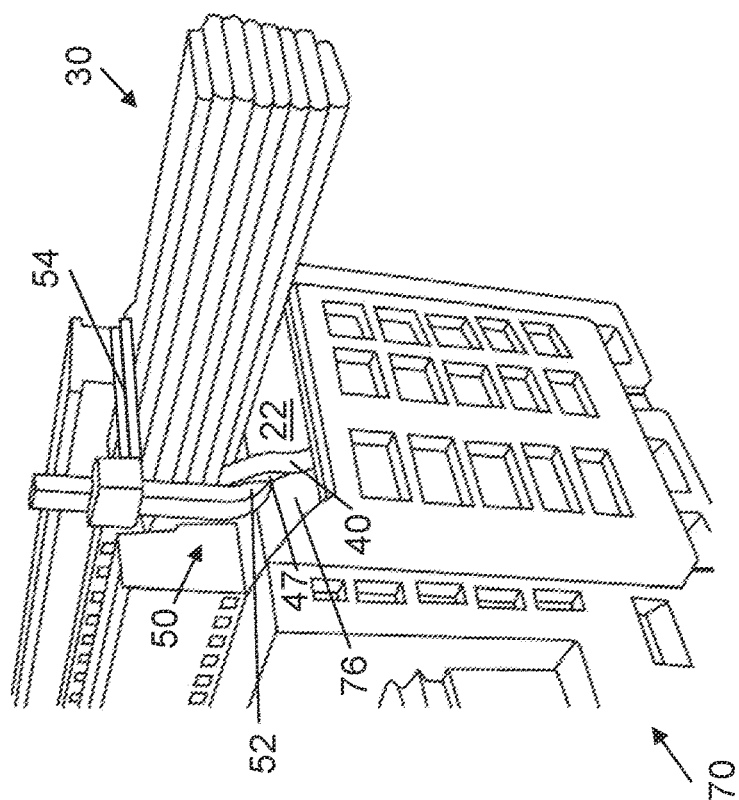
FIG. 14 shows a perspective view of the cable fixing accessory according to an embodiment attached to a housing.

The cable fixing accessory 10 shown also includes retaining elements 60. The retaining elements 60 shown include two barbs 62 and two adjusting hooks or adjusting elements 64. The retaining elements 60 can be set up to hold the cable fixing accessory 10 to a housing 70, e.g. to a housing as shown in FIG. 8 or 14. FIG. 10 schematically shows another perspective view of the cable fixing accessory 10 from FIG. 9. Identical reference signs show the same or similar elements.

Figure 12:
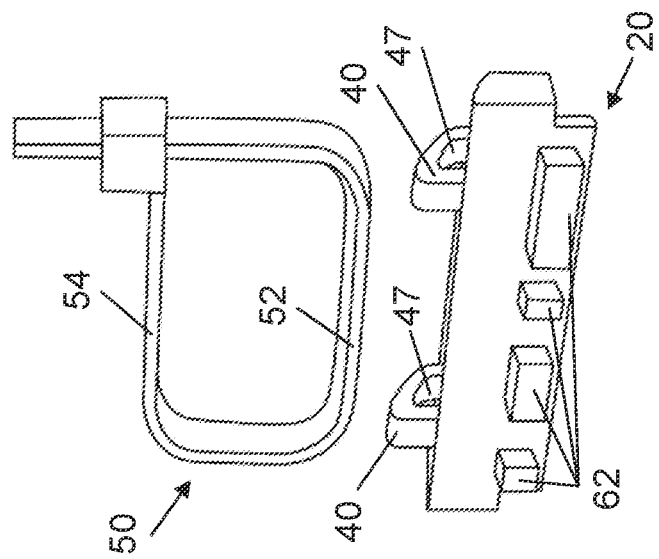
FIG. 12 shows another perspective view of the cable fixing accessory of FIG. 11.
Figure 11:
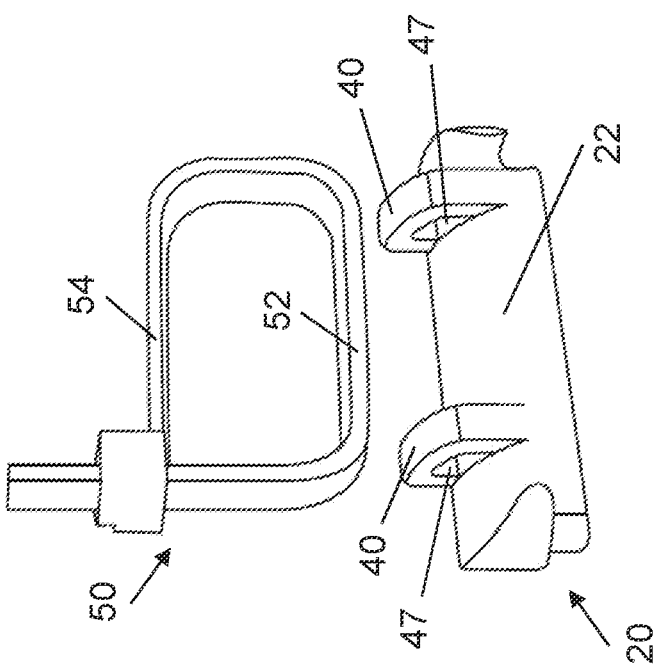
FIG. 11 shows a perspective view of a cable fixing accessory according to another embodiment.

FIG. 11 schematically shows a perspective view of a cable fixing accessory 10 according to another embodiment. The cable fixing accessory 10 may have similarities with the versions shown in FIG. 9 or 10. The cable fixing accessory 10 also includes a fixing element 50, which is designed as a cable tie. The fixing element 50 is designed to be arranged with its upper part 54 through the duct 47 and with its lower part 52 around the cylinder segment 20. The cylinder segment 20 may have grooves or the like to contribute to a permanent fixing of the fixing element 50 or of the cables to be fixed to it. FIG. 12 schematically shows another perspective view of the cable fixing accessory 10 from FIG. 11.

Figure 13:
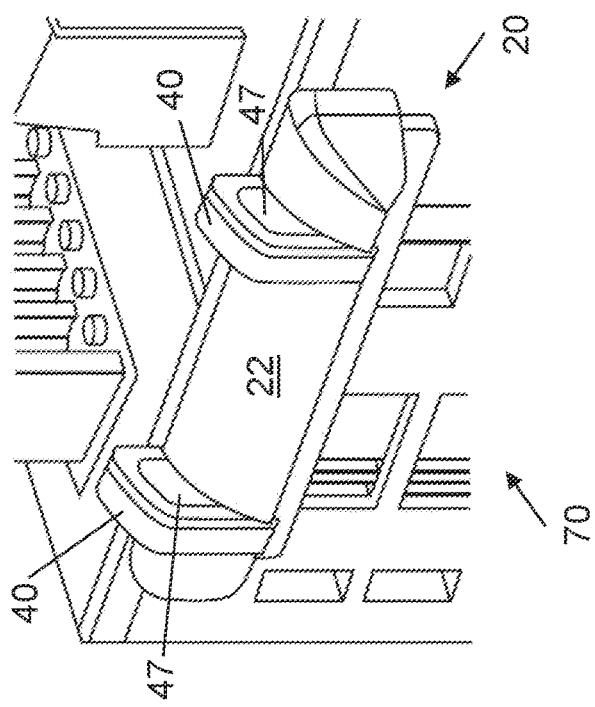
FIG. 13 shows a perspective view of the cable fixing accessory of FIG. 9 or 10 attached to a housing.

FIG. 13 shows schematically a perspective view of the cable fixing accessory 10 attached to a housing from FIG. 9 or 10. The cable fixing accessory 10 can be fixed to the housing 70 with a retaining element 60 (not shown in FIG. 13, see examples in FIGS. 9 to 12), which may be located on a back of the cable fixing accessory 10. The retaining element 60 can, for example, take the form of a barb, which provides a snap mechanism for snapping into openings in the housing 70. The retaining element 60 can be designed as an adjustment hook that can correspond to openings in the housing 70. The retaining element 60 can, for example, be designed as part of the housing 70, in particular as an integral part of the housing 70.

FIG. 14 schematically shows a perspective view of a cable fixing accessory 10 according to an embodiment attached to a housing. The cable fixing accessory 10 is designed as part of a housing element 75, in particular a ventilation grille of an electrical or electronic device. The surface 22 is part of an upper section 76 of the housing element 75. A fixing element 50 is looped around a cable bundle 30. An upper part 54 is placed on the uppermost cable, a lower part 52 runs under the surface 22 through the upper area 76 of the housing element 75.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 cable fixing accessory
20 cylinder segment
21 undercut
22 surface
24 radius of curvature
25 central axis
26 angle
27 first passage
28 extension element
29 edge area
30 cables
32 conductive core
34 diameter
38 insulation element
40 limiting element, edge element
42 height
47 second passage
50 fixing element
52 bottom part
54 top part
60 retaining element
62 barbs
64 adjusting elements
70 housing
75 housing element
76 upper area

What is claimed is:

1. A cable fixing accessory, comprising:
a cylinder segment having a surface,
wherein the surface of the cylinder segment is configured to bend a cable having an electrically conductive core at least partially around the surface of the cylinder segment,
wherein a portion of the surface of the cylinder segment, which is configured to have direct contact with the cable, has a radius of curvature that is greater than or equal to six times a diameter of the electrically conductive core of the cable, and
wherein, in direction of the curvature of the surface and directly adjoining an upper portion of the surface, a bridge within the cylinder segment is formed in such a way that the bridge corresponds to an opening in the upper portion of the surface and is smaller than the opening, so that a first passage through the cylinder segment is formed between the opening and the bridge, and that the bridge is substantially parallel to the upper portion of the surface.

2. The cable fixing accessory according to claim 1, wherein the cylinder segment has a predefined angle between 30° and 190°.

3. The cable fixing accessory according to claim 1, further comprising an extension element,
wherein the extension element extends in a direction substantially tangential to a central axis of the cylinder segment and has a flat and/or convex surface,
wherein a surface of the extension element is configured to extend the surface of the cylinder segment, and
wherein a radius of curvature of the surface of the extension element is greater than or equal to six times the diameter of the electrically conductive core of the cable.

4. The cable fixing accessory according to claim 1, wherein the surface of the cylinder segment comprises a rubber-like material.

5. The cable fixing accessory according to claim 3, further comprising at least one edge element,
wherein the at least one edge element projects radially from the surface of the cylinder segment and/or the extension element.

6. The cable fixing accessory according to claim 5, further comprising a fixing element,
wherein the fixing element is configured to fix the cable to the cable fixing accessory.

7. The cable fixing accessory according to claim 6, wherein the fixing element is configured to be guided around or through the at least one edge element.

8. The cable fixing accessory according to claim 6, further comprising a second passage through the at least one edge element,
wherein the fixing element is configured to pass through the first passage and/or through the second passage.

9. The cable fixing accessory according to claim 1, further comprising a retaining element,
wherein the retaining element is configured to hold the cable fixing accessory to a housing.

10. The cable fixing accessory according to claim 1, wherein the cable fixing accessory is part of a housing or a housing member.

11. The cable fixing accessory according to claim 5, wherein the at least one edge element comprises two or three edge elements.

12. The cable fixing accessory according to claim 1, wherein the cylinder segment is hollow, solid, or partially solid.

13. The cable fixing accessory according to claim 1, wherein the cable fixing accessory is configured to bend the cable along a surface of the cable fixing accessory, and wherein a radius of curvature of the surface of the cable fixing accessory is greater than or equal to six times the diameter of the electrically conductive core of the cable.

14. An electronic device, comprising: a housing of the cable fixing accessory according to claim 1.

15. The electronic device according to claim 14, wherein the electronic device comprises a programmable logic controller (PLC) or I/O device.

16. The cable fixing accessory according to claim 2, wherein the predefined angle is between 60° and 150°.

17. The cable fixing accessory according to claim 16, wherein the predefined angle is between 75° and 95°.

* * * * *